United States Patent [19]

Laub et al.

[11] Patent Number: 5,344,334
[45] Date of Patent: Sep. 6, 1994

[54] HINGED COVER FOR AN ELECTRICAL SOCKET

[75] Inventors: Michael F. Laub, Etters; Richard E. Rothenberger, Harrisburg, both of Pa.

[73] Assignee: The Whitaker Corporation, Wilmington, Del.

[21] Appl. No.: 75,698

[22] Filed: Jun. 11, 1993

[51] Int. Cl.⁵ .......................................... H01R 13/62
[52] U.S. Cl. .................................... 439/331; 439/73
[58] Field of Search ............ 439/71, 72, 73, 328–331, 439/526, 525

[56] References Cited

U.S. PATENT DOCUMENTS

| | | |
|---|---|---|
| 4,427,249 | 1/1984 | Bright et al. |
| 4,456,318 | 6/1984 | Shibata et al. ............. 439/331 |
| 4,502,747 | 3/1985 | Bright et al. |
| 4,560,216 | 12/1985 | Egawa . |
| 4,598,965 | 7/1986 | Bricaud et al. |
| 4,601,525 | 7/1986 | Kandybowski . |
| 4,621,884 | 11/1986 | Berkebile, Jr. et al. |
| 4,657,328 | 4/1987 | Matsuoka . |
| 4,706,161 | 11/1987 | Buckingham ............. 439/331 |
| 4,761,140 | 8/1988 | Geib ........................ 439/71 |
| 4,832,612 | 5/1989 | Grabbe et al. ............ 439/331 |
| 5,100,333 | 3/1992 | Suzuki ....................... 439/73 |
| 5,109,980 | 5/1992 | Matsuoka et al. .......... 439/331 |
| 5,120,238 | 6/1992 | Marks et al. ............... 439/73 |
| 5,163,837 | 11/1992 | Rowlette, Sr. ............. 439/331 |

*Primary Examiner*—Larry I. Schwartz
*Assistant Examiner*—Hien D. Vu
*Attorney, Agent, or Firm*—Driscoll A. Nina

[57] ABSTRACT

A hinged cover for an electrical socket having a top plate fixed relative the socket's housing and a cover plate pivotally attached to the top plate for removably retaining an electronic package in electrical engagement with contacts within the housing by compressing the electronic package against the contacts. The top plate is fixed relative to the housing of the socket and has integrally formed hinge members and first latch portions. The cover plate is pivotally movable between an open position and a closed position. The cover plate has an integrally formed complementary hinge member that is receivable about the hinge member and a second latch portion integrally formed with the cover plate and disconnectably engageable with the first latch portion to hold the cover in the closed position, thereby enabling the cover plate to exert the necessary force against the electronic package.

12 Claims, 2 Drawing Sheets

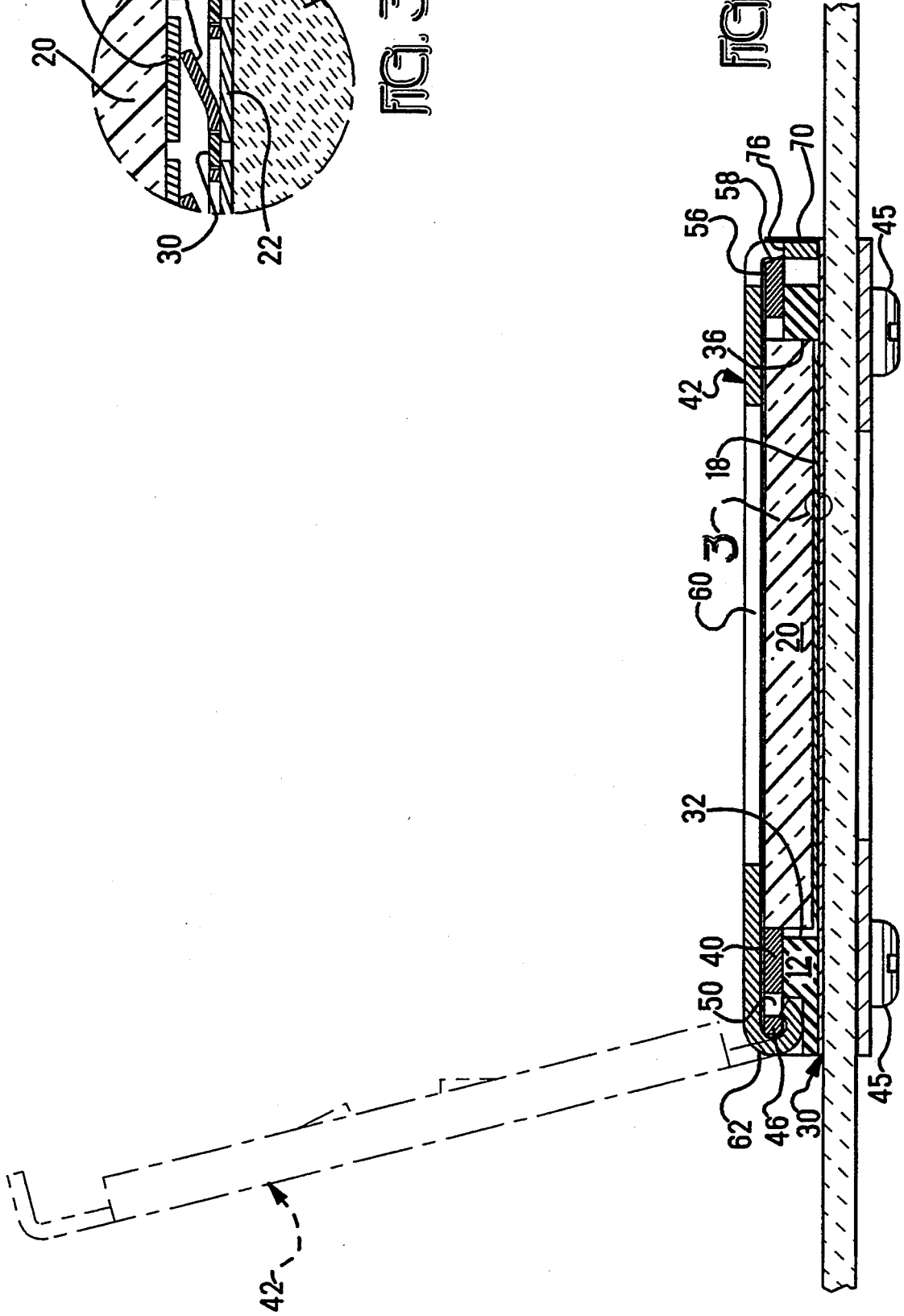

HINGED COVER FOR AN ELECTRICAL SOCKET

FIELD OF THE INVENTION

This invention relates to electrical sockets that have a pivotable cover for maintaining electrical engagement between an electronic package and a substrate.

BACKGROUND OF THE INVENTION

When connecting electronic packages, such as a leadless chip carrier (LCC), to a substrate, such as a printed circuit board (PCB), it is necessary to position the package upon the substrate and exert a force upon the package to maintain an electrical connection between contact pads on the package and respective circuit pads on the substrate. One way to accomplish this is through an electrical socket that utilizes a cover to exert the necessary force. There are various applications where it is desirable to be able to interchange the electronic package, for example: replacing faulty electronic packages; up-grading the system by way of replacing the electronic package; product development of either the electronic package itself or the system within which it is used; and burn-in/testing of the electrical package. A cover that is hinged to the socket is especially attractive because the cover remains with the socket.

U.S. Pat. No. 4,621,884 discloses an electrical socket having a hinged cover that utilizes a separate U-shaped hinge pin to connect the cover to the socket. The hinge pin is pivotally connected to the cover and engages opposing downwardly facing shoulders on the socket to keep the cover attached to the socket. The cover has spaced apart latching means for engaging another set of shoulders.

U.S. Pat. No. 4,601,525 discloses an electrical connector having a hinged cover that has an integral release means. The cover is connected to the socket by way of bosses that are part of the dielectric socket housing and extend outwardly from downwardly extending sides of the socket. The cover has holes that movably engage the bosses enabling pivotable motion of the cover.

What is needed is a low-height socket having a hinged and latchable cover that utilizes a minimum number of components while being reliable through numerous opening/closing cycles. The socket should be simple to construct, assemble, and operate, thereby reducing the associated costs.

SUMMARY OF THE INVENTION

A hinged cover for an electrical socket with resilient contacts within a housing that are in electrical engagement with circuit pads on a substrate, the housing having a well for removably receiving and positioning an electronic package so that contact pads thereupon are connected with respective circuit pads upon a substrate by way of the contacts. The hinged cover having a top plate fixed relative the housing having side portions surrounding the well, a hinge member integrally formed within one of the side portions, and a first latch portion integrally formed within at least one of the side portions. The hinged cover also includes a cover plate for removably retaining the electrical package within the well and engaged with the respective contacts, the cover having an integrally formed complementary hinge member for interlocking the cover to the top plate, the complementary hinge member being receivable about the hinge member such that the cover is pivotally movable between an open position, where the electronic package is removable from the well, and a closed position, where the cover retains the electronic package within the well; and a second latch portion integrally formed with the cover and disconnectably engageable to the first latch portion to hold the cover in the closed position.

It is an object of this invention to provide a hinged cover for an electrical connector.

It is a feature of this invention to have the hinged members and the latch portions integrally formed within the hinged cover. It is another feature of this invention that the hinged cover may be made of metal.

It is an advantage of this invention that by forming the hinge members and the latch portions integrally with the hinged cover the manufacturing costs are reduced. It is another advantage of this invention that significant forces may be exerted upon an electronic package within the socket by the cover. It is yet another advantage of this invention that the hinged cover is reliable through numerous opening and closing cycles making the use of the cover especially attractive in testing and burn-in applications. It is still another advantage of this invention that it may be applied to various connector styles where a normal force must be maintained against the electronic package.

Other objects, features and advantages of the invention will become apparent upon inspection of the following FIGURES and the description of the preferred embodiment.

DESCRIPTION OF THE DRAWINGS

The invention will now be described by way of example with reference to the accompanying drawings in which:

FIG. 2 is a cut-away view of the electrical socket having an electronic package in the closed position and including a phantom representation of the open position.

FIG. 3 is a cross sectional view of contacts with the electrical socket in an open position.

DETAILED DESCRIPTION OF THE PREFERRED EMBODIMENT

Figure 1:
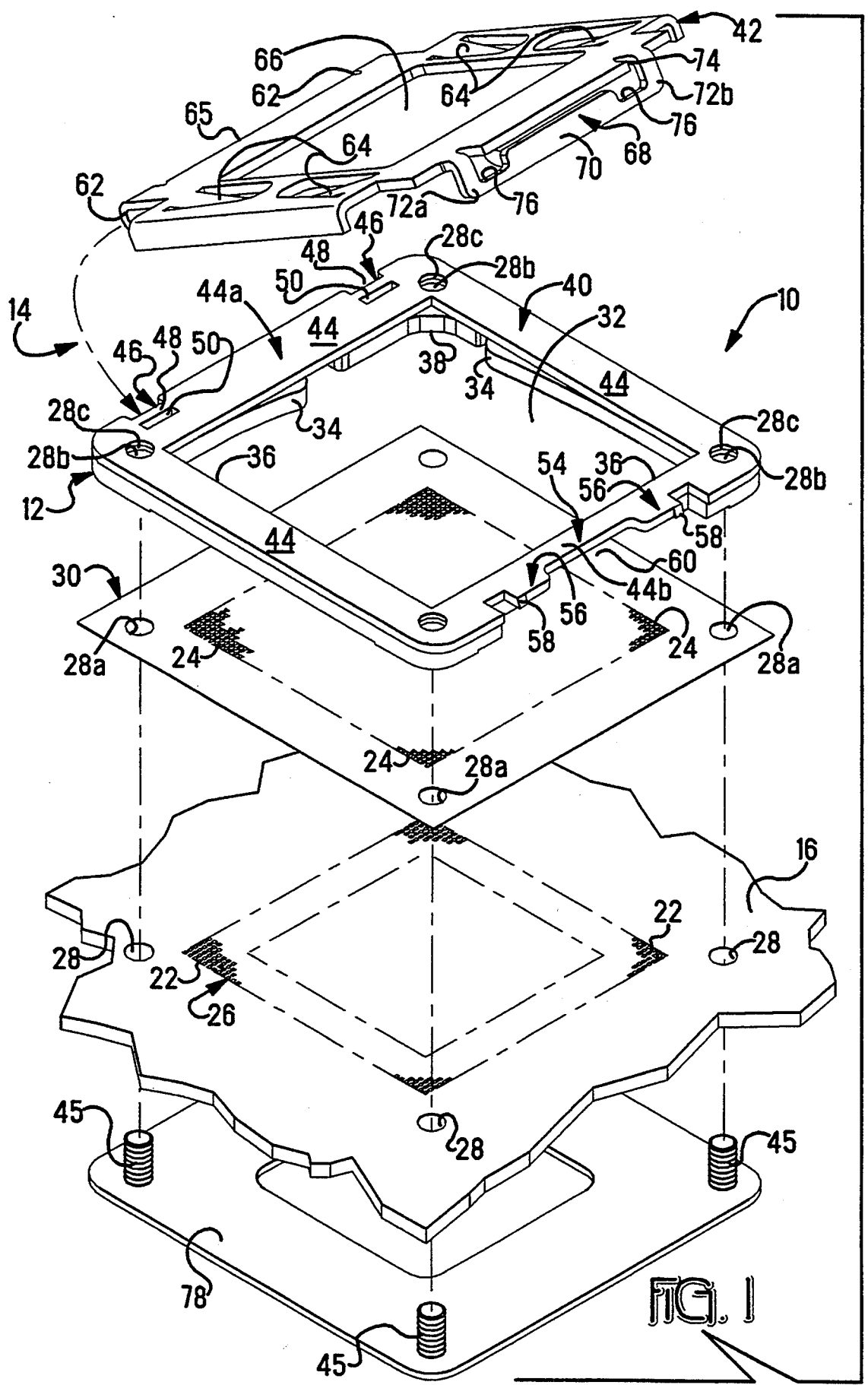
FIG. 1 is an exploded perspective view of the electrical socket in a partially open state, including a cut-away portion of a substrate.

FIG. 1 shows the components of a low-height electrical socket 10, having a frame-like housing 12 and a hinged cover 14, that is mountable upon a substrate 16, such as a printed circuit board. As best seen in FIG. 2, the low-height electrical socket 10 is used to establish and maintain electrical interconnection between contact pads 18 on an electronic package 20, such as a leadless chip carrier, and circuit pads 22 upon the substrate 16 by way of contacts 24 therebetween.

As seen in FIG. 1, the substrate 16 has a large number of circuit pads 22 in a land grid array (LGA) 26. These circuit pads 22 are electrically connected to components (not shown) upon the substrate 16 for establishing an electrical circuit to the components. Positioned around the LGA 26 are a number of mounting holes 28 used to attach the components of the low-height electrical socket 10 to the substrate 16.

In order to provide an interchangeable connection with the circuit pads 22, a contact member 30 containing compressible resilient contacts 24 is positioned upon the substrate 16. The contacts 24 are arranged within the contact member 30 in a relationship that corresponds with the LGA 26 upon the substrate 16. The contact member 30 has mounting holes 28a that correspond to the mounting holes 28 in the substrate 16.

The housing 12 of the electrical socket 10 has mounting holes 28b corresponding to those in the substrate 16 in order to affix the housing 12 to the substrate 16. The housing 12 is dielectric with a frame-like shape defining an interior well 32 that removably receives and positions the electronic package 20 relative to the contacts 24. The housing 12 is placed upon the contact member 30 so that the contacts 24 are exposed within the well 32.

The housing 12 has resilient biasing portions 34 within the well 32 for registering the electronic package 20 into proper position. The resilient biasing 34 portions function by forcing the electronic package 20 against reference edges 36 of the well 32 to assure that repeatable electrical connection occurs. The housing 12 may also include a keying feature 38, complementary to a corresponding feature (not shown) on the electronic package 20, to assure correct orientation when inserting the electronic package 20 into the well 32.

The hinged cover 14 having a top plate 40 and a cover plate 42 overlies the housing 12. The top plate 40, having threaded mounting holes 28c that correspond to the mounting holes 28,28a,28b in the other components, is attached by screws 45. Alternatively, other types of fasteners maybe used, the top plate 40 may be overmolded into the housing 12 or bonded thereto by an adhesive to affix the top plate 40 to the housing 12. The combined thickness of the top plate 40 and the housing 12 is approximately equal to the thickness of the electronic package 20. The top plate 40 is generally flat and has interconnected side portions 44 about the well 32 enabling the electrical package 20 to be placed therein. Within one of the side portions 44a is a pair of hinge members 46. The hinge member 46 is a bar 48 that is continuous with the side portion 44a and is formed by creating a rectangular aperture 50 through the side portion 44a close to the outer perimeter of the top plate 40. The material of this side portion 44a that is left between the aperture 50 and the perimeter is the bar 48. A single hinge member may also be used.

Incorporated into the top plate 40, generally opposite the hinge member 46, within at least one of the side portions 44, is a first latch portion 54. This first latch portion 54 is a pair of spaced apart detents 56 formed into the periphery of the top plate 40. A camming surface 58 is incorporated into each of the detents 56. A release opening 60 is formed between the detents 56 by relieving the side portion 44. The camming surface 58 and the release opening 60 are further described below.

The cover plate 42 is pivotally attached to the top plate 40, as shown in FIG. 2, and maintains the electronic package 20 within the well 32 in electrical engagement with the contacts 24. The cover plate 42 is attached to the top plate 40 by two integrally formed complementary hinge members 62. These complementary hinge members 62 are received about their respective hinge member 46 for pivotally interlocking the cover plate 42 to the top plate 40, thereby forming the hinged cover 14. The complementary hinge members 62 are hook-shaped protrusions that fit around the bars 48 in the top plate 40, as best seen in FIG. 2. The cover plate 42 is relieved of material between the two complementary hinge members 46 forming a recess 65 that enables pivoting of the cover plate 42 between an open position and a closed position. In the open position, the cover plate 42 pivots back from the top plate 40 so that the electronic package 20 can be removed from the well 32, and when in the closed position, the cover plate 42 engages the electronic package 20, holding it in position within the well 32.

The cover plate 42 includes resilient fingers 64, free of the cover plate 42 on three sides and bent downward therefrom to press upon the electronic package 20 when the cover plate 42 is in the closed position. The fingers 46 exert a normal spring force upon the electronic package 20 when the cover plate 42 is closed, thereby keeping the contact pads 18 on the electronic package 20 engaged with the contacts 24. A central opening 66 is provided in the cover plate 42 that exposes the electronic package 20.

The cover plate 42 also includes a second latch portion 68 integrally formed therewith in a corresponding relationship to the first latch portion 54. The second latch portion 68 is a latching beam 70 that is continuous with the cover plate 42 at each end 72a,72b and separated from the cover plate 42 along its length by a gap 74. The latching beam 70 is formed in a manner similar to the bar 48 in the top plate 40 with the additional step of bending the latching beam 70 into a generally orthogonal relationship with the rest of the cover plate 42. The gap 74 coincides with the release opening 60 in the top plate 40. The latching beam 70 includes detent seats 76 that engage the detents 56 to keep the cover plate 42 in the closed position, as seen in FIG. 2. An alternative configuration may have the detents 56 incorporated into the cover plate 42 and the latching beam 70 may be part of the top plate 40.

The first latch portion 54 and the second latch portion 68 are mated by pressing the cover plate 42 together with the top plate 40. This causes the latching beam 70 to slide over the camming surface 58 on the detents 56 producing a slight deflection of the latching beam 70 that enables the latching beam 70 to pass smoothly over the detents 56. As the cover plate 42 is pushed down, the detent seats 76 will pass the detents 56 and the deflected latching beam 70 will return to its original undeflected position. The latching beam 70 is now under the detents 56, as shown in FIG. 2, thereby positively capturing the cover plate 42 to the top plate 40 of the housing 12 and maintaining the normal spring force exerted by the resilient fingers 64.

The cover plate 42 is released from the top plate 40 by placing an object (not shown), such as a screw driver, into the gap 74 of the cover plate 42 into the release opening 60 of the top plate 40 and prying the latching beam 70 from under the detents 56. The normal spring force generated by the resilient fingers 64 is sufficient to pop open the cover plate 42.

When being used with electronic packages 20 requiring a large number of interconnections, substantial normal spring forces must be exerted by the resilient fingers 64. This produces significant stresses within the cover plate 42 that are exerted on the hinge members 46,62 and the latch portions 54,68. The effect of these stresses may be minimized by placing the hinge members 46,62 and the detents 56 as closely as possible to in-line with the resilient fingers 64. However, in these instances, it is particularly advantageous to form the top plate 40 and the cover plate 42 from a metal. The metal may be tempered to achieve the required strength without excessive thickness, making this hinged cover 10 particularly appropriate for low-height uses. In addition, having the latch portions 54,68 and the hinge members 46,62 made of metal, significantly improves not only their strength, but also their wear characteristics, enabling repeated cycling without functional deterioration.

Where these high normal spring forces are present, a back-up plate 78 may be placed on the opposite side of the substrate 16 from the low-height socket 10 and attached thereto by the aforementioned screws 45 used to connect the substrate 16, contact member 30, the housing 12 and the hinged cover 14. The back-up plate 78 supports the substrate 16. This protects the substrate 16 during latching and prevents distortion of the substrate 16 after the hinged cover 14 is latched due to the high normal force being exerted by the resilient fingers 64.

It should be recognized that the above-described embodiments and forms, constitute the presently preferred form of the invention and that the invention may take numerous other forms, only some of which have been described above. Accordingly, the invention should be only limited by the scope of the following claims.

We claim:

1. An electrical socket attachable to a substrate for removably receiving and positioning an electronic package so that contact pads thereupon are connected with respective circuit pads upon the substrate, the electrical socket comprising:
    a contact member having a plurality of contacts for electrically connecting the contact pads to the circuit pads;
    a frame-like housing upon the contact member defining a well for removably receiving and positioning the electronic package so that the contact pads correspond with the contacts;
    a hinged cover having
        a top plate fixedly positioned relative to the housing and having interconnected side portions about the well, the top plate including an integrally formed hinge member within one of the side portions, said hinge member comprising a bar formed by creating an aperture in said side portion wherein said bar connects to said top plate at two points and a first latch portion integrally formed within an opposite one of the side portions; and
        a cover plate for maintaining the contact pads of the electronic package engaged with the circuit pads of the substrate, the cover plate having an integrally formed hook shaped complementary hinge member receivable about the hinge member for pivotally interlocking the cover plate to the top plate such that the cover plate is movable between an open position, where the electronic package is removable from the well, and a closed position, where the cover plate exerts a force on the electronic package to cause the contact pads to engage the contacts; and a second latch portion integrally formed with the cover plate and disconnectably engageable with the first latch portion of said top plate to maintain the closed position.

2. The electrical socket of claim 1, wherein the top plate includes a plurality of spaced apart hinge members and the cover plate includes a plurality of complementary hinge members spaced to correspond with the hinge members.

3. The electrical socket of claim 1, wherein the first latch portion is a detent having a camming surface thereupon and the second latch portion is a deflectable latching beam continuous with the cover plate at each end, the latching beam slidably engaging the camming surface during closing, thereby being deflected over the detent during closing, upon reaching the closed position the latching arm disengages the camming surface and is positively captured by the detent.

4. The electrical socket of claim 3, wherein the deflectable latching beam is generally orthogonal to the cover plate.

5. The electrical socket of claim 1, wherein the top plate is made of a metal.

6. The electrical socket of claim 1, wherein the top plate and the hinge member are co-planer.

7. The electrical housing of claim 1, wherein the cover is made of metal.

8. The electrical housing of claim 1, wherein the top plate and the cover are made of metal.

9. The electrical socket of claim 1, wherein the top plate is attachable to the substrate by a plurality of screws.

10. The electrical socket of claim 1, wherein the first latch portion is a pair of spaced apart detents, each having a camming surface thereupon and the second latch portion is a deflectable latching beam spanning the spaced apart detents and spaced away from the cover plate for positively engaging the detents when the cover is in the closed position.

11. The electrical socket of claim 9, wherein the camming surface and the latching beam are metal.

12. A hinged cover for an electrical socket having a contact member including contacts within a housing that are in electrical engagement with circuit pads on a substrate, the housing having a well for removably receiving and positioning an electronic package so that contact pads thereupon are connected with respective circuit pads upon a substrate by way of the contacts, the hinged cover comprising:
    a top plate fixed relative to the housing having side portions surrounding the well; an integrally formed hinge member comprising at least one bar having an adjacent recess wherein said bar connects to said top plate at two points within one of the side portions; and a first latch portion integrally formed within an opposite one of the side portions; and
    a cover plate for removably retaining the electronic package within the well and the contact pads of the electronic package engaged with the respective contacts, the cover plate having an integrally formed hook shaped complementary hinge member for interlocking the cover plate to the top plate, the complementary hinge member being receivable about the hinge member such that the cover plate is pivotally movable between an open position, where the electronic package is removable from the well, and a closed position, where the cover plate retains the electronic package within the well; and a second latch portion integrally formed with the cover plate and disconnectably engageable with the first latch portion of said top plate to maintain the closed position to hold the cover plate in the closed position.

* * * * *